United States Patent [19]
Tada

[11] Patent Number: 5,365,083
[45] Date of Patent: Nov. 15, 1994

[54] SEMICONDUCTOR DEVICE OF BAND-TO-BAND TUNNELING TYPE

[75] Inventor: Yoshihide Tada, Chiba, Japan

[73] Assignee: Kawasaki Steel Corporation, Kobe, Japan

[21] Appl. No.: 194,626

[22] Filed: Feb. 8, 1994

Related U.S. Application Data

[63] Continuation of Ser. No. 799,063, Nov. 27, 1991, abandoned.

[30] Foreign Application Priority Data

Nov. 29, 1990 [JP] Japan ................... 2-325759
Oct. 16, 1991 [JP] Japan ................... 3-267706

[51] Int. Cl.$^5$ ............... H01L 29/88; H01L 27/01; H01L 29/00
[52] U.S. Cl. ................... 257/105; 257/365; 257/603
[58] Field of Search ............... 257/104, 105, 106, 603, 257/604, 606, 365

[56] References Cited

U.S. PATENT DOCUMENTS 3,045,129 12/1960 Atalla et al. ................... 257/105
4,907,053 3/1990 Ohmi ................... 357/23.1

FOREIGN PATENT DOCUMENTS 0050988 5/1982 European Pat. Off. ............. 257/105
2490874 9/1981 France ................... 257/105

OTHER PUBLICATIONS

Patent Abstracts of Japan–vol. 10, No. 108 (E-398)(2165) 23 Apr. 1986.
Applied Physics Letters–vol. 52, No. 19, 9 May 1988, New York, USA.

Primary Examiner—Andrew J. James
Assistant Examiner—Donald L. Monin, Jr.
Attorney, Agent, or Firm—Oliff & Berridge

[57] ABSTRACT

A semiconductor device of band-to-band tunneling type including a silicon substrate, a first gate electrode formed by a highly doped surface region of the silicon substrate, a first silicon oxide film formed on a surface of the surface region, a silicon thin film formed on the first silicon oxide film, a second silicon oxide film formed on a surface of the thin silicon film, and a second gate electrode formed by a metal film applied on a surface of the second silicon oxide film. In the thin silicon film, there are formed P and N type regions side by side to constitute a PN junction. When a gate bias voltage is applied across the first and second gate electrodes, a band bend having a large height and inclination in a direction perpendicular to the thin silicon film is produced in the depletion region in the vicinity of the PN junction. Minority carriers brought up from the valence band into the conduction band by tunneling due to the band bend are conducted through the PN junction under the influence of a reverse bias voltage applied across the PN junction. The band bend can be made large at will by increasing the gate bias voltage, so that it is possible to obtain a large tunneling current.

16 Claims, 6 Drawing Sheets

FIG_1
PRIOR ART
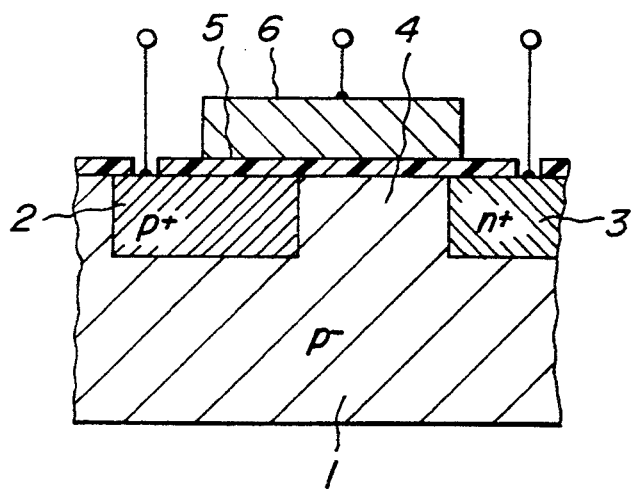
FIG_2
PRIOR ART
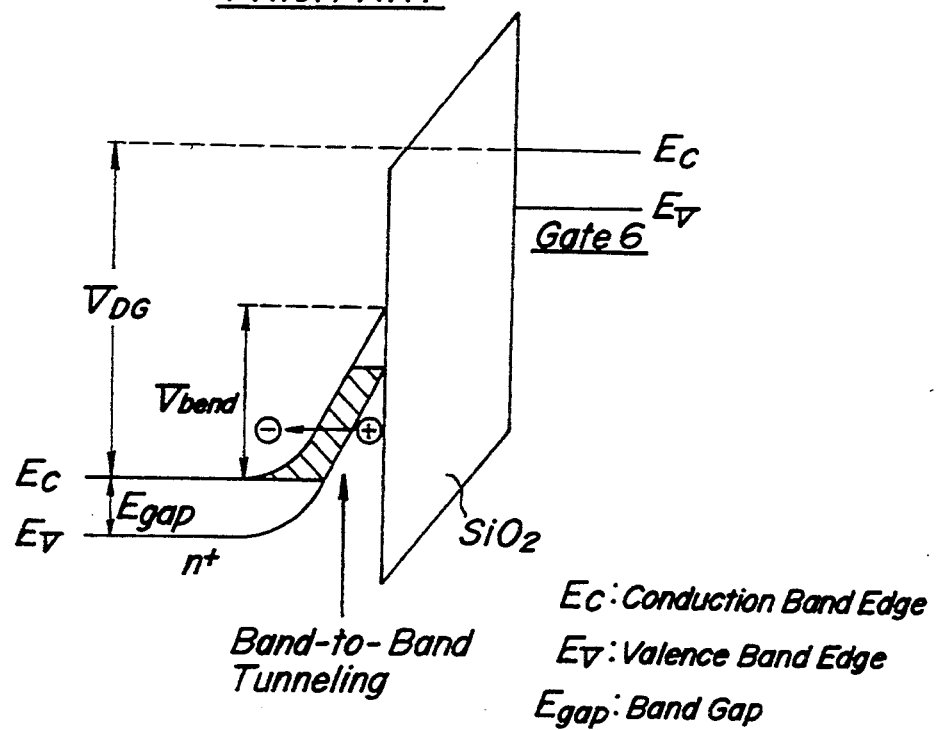
$E_c$: Conduction Band Edge
$E_V$: Valence Band Edge
$E_{gap}$: Band Gap

FIG._4A
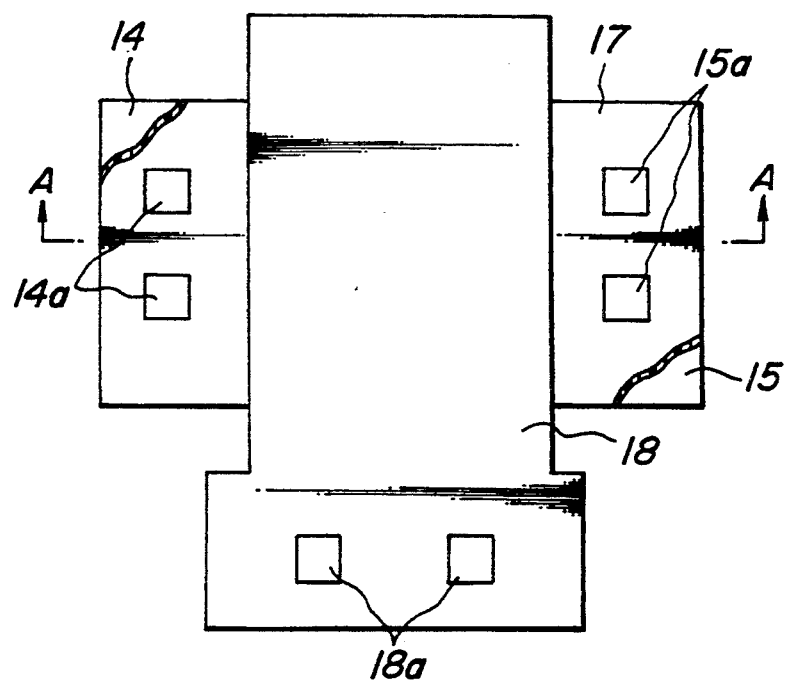
FIG._4B
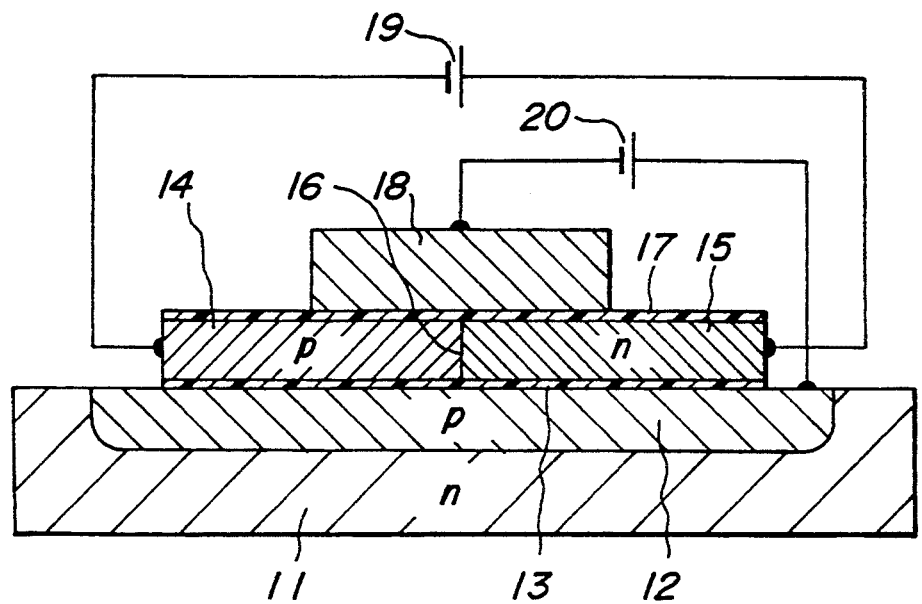

$E_{F1}$: Fermi Level in Back Gate Electrode
$E_{F2}$: Fermi Level in Top Gate Electrode FIG_6
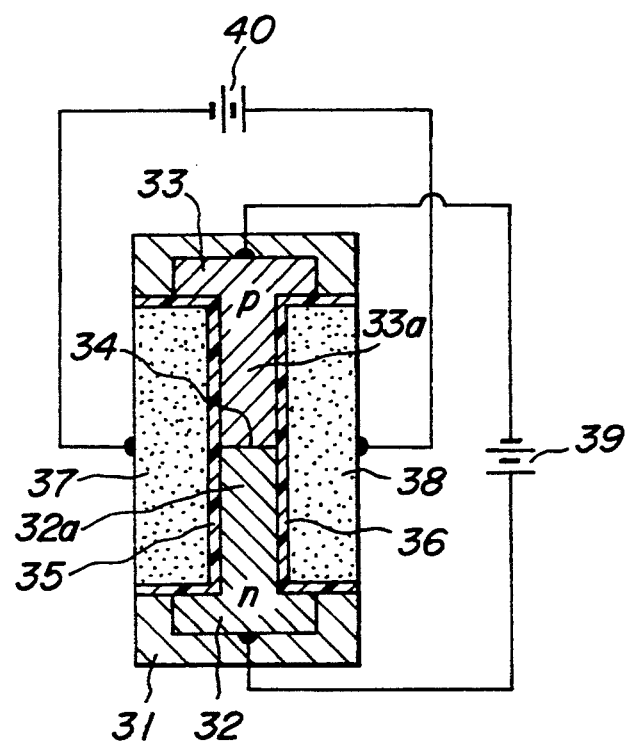

FIG._7A
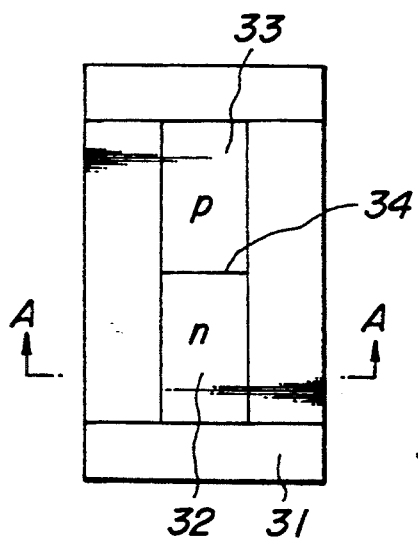
FIG._7B
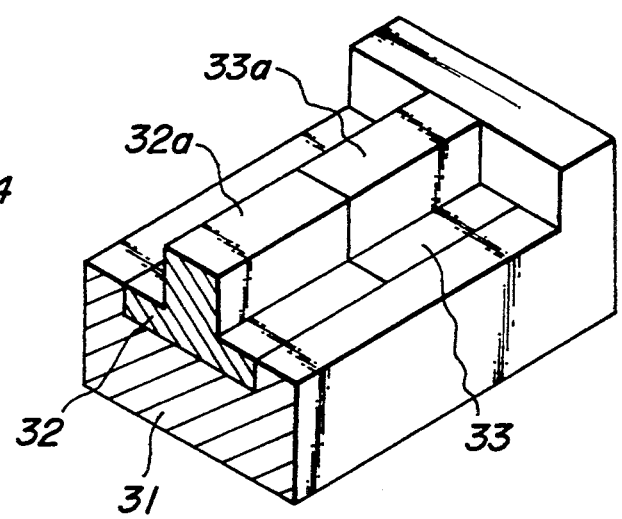
FIG._7C
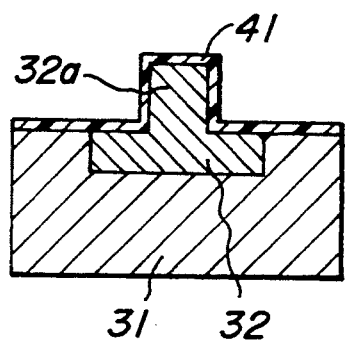
FIG._7D
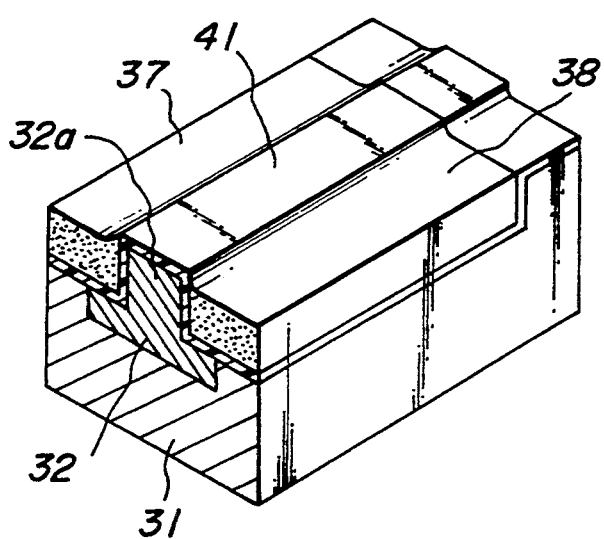

SEMICONDUCTOR DEVICE OF BAND-TO-BAND TUNNELING TYPE

This is a continuation of application Ser. No. 07/799,063 filed Nov. 27, 1991, now abandoned.

BACKGROUND OF THE INVENTION

1. Field of the Invention

The present invention relates to a semiconductor device of a band-to-band tunneling type.

2. Description of the Related Art

There has been proposed a new type transistor utilizing the band-to-band tunneling (BBT) phenomenon. In this BBT transistor, there does not occur a problem of the well known short channel effect in the widely used MOS FET, and thus it can be minuaturized to a larger extent than the MOS FET.

FIG. 1 is a cross sectional view showing an example of a known BBT transistor. The transistor comprises a P− silicon substrate 1, a P+ drain region 2 and an N+ source region 3, these regions being formed in one surface of the silicon substrate. The drain region 2 and source region 3 are separated from each other such that a channel region 4 is formed therebetween. On the silicon substrate 1 there is formed a silicon oxide film 5 and on this silicon oxide film there is provided a gate electrode 6 such that the gate electrode covers a part of the drain region 2 and the channel region 4. In this known BBT transistor, by applying a suitable reverse potential between the drain region 2 and the source region 3 and by applying a suitable bias potential to the gate electrode 5, there is produced a band bend in a surface region of a part of the drain region 2 underneath the gate electrode.

FIG. 2 is a schematic view illustrating the energy diagram of the above mentioned band bend produced in the interface region in the drain region 2 between the silicon substrate 1 and the silicon oxide layer 5 underneath the gate electrode 6. At the band bend, minority carriers, i.e. electrons are moved from the valence band into the conduction band by the tunneling phenomenon and are collected into the source region 3 via the channel region 4 to cause a current flowing from the source region 3 to the drain region 2.

In the above mentioned known BBT transistor, the band bend is realized in the depletion region formed in the surface region of the silicon substrate 1 and the height $V_{bend}$ of the band bend is limited by the impurity concentration in the drain region 2, so that the band bend could not be made large under the given bias condition. That is to say, when the impurity concentration is low, the depletion region is expanded and the strength of the electric field which relates to the inclination of the band bend is reduced, so that the inclination of the band bend is decreased although the height $V_{bend}$ of the band bend can be made large as shown in FIG. 3A. Therefore, the tunneling is hardly generated. When the impurity concentration of the drain region 2 is increased, the electric field becomes strong so that the inclination of the band bend is increased, but the height $V_{bend}$ of the band bend is decreased as illustrated in FIG. 3C, because the depletion region becomes small due to increased depletion layer capacitance. When the height V bend of the band bend becomes smaller than the band gap, the tunneling does no more occur. In this manner, in order to perform the tunneling sufficiently, both the inclination and the height of the band bend have to be increased. However, in the known BBT transistor these conditions could not be satisfied simultaneously. Therefore, in the known BBT transistor, a significant tunneling current can be obtained only in a very critical condition depicted in FIG. 3B, said critical conditions corresponding to a very narrow range of the impurity concentration such as $2 \sim 5 \times 10^{18}$ atoms/cm$^3$ and more particularly about $3 \times 10^{18}$ atoms/cm$^3$. Even in this impurity concentration range, the tunneling current is very small such as several nano amperes. Therefore, a sufficiently large current driving property could not be obtained and a high speed switching operation could not be realized.

SUMMARY OF THE INVENTION

The present invention has for its object to provide a novel and useful semiconductor device of band-to-band tunneling type, in which the above mentioned drawbacks of the known band-to-band tunneling transistor can be effectively removed and both the inclination and the height of the band bend can be increased such that a large tunneling current can be obtained and thus the large current driving property and high speed operation can be realized, while the semiconductor device can be miniaturized to an optimum extent.

According to a basic conception of the present invention, a semiconductor device of band-to-band tunneling type comprises:

a first semiconductor region having one conductivity type and including a surface;

a second semiconductor region having the opposite conductivity type and including a surface which is adjoined with said surface of said first semiconductor region to form a PN junction therebetween;

a first biasing means for applying a reverse bias voltage across said PN junction; and a second biasing means for applying a gate bias voltage to said first and second semiconductor regions such that a depletion region is produced in said first and second semiconductor regions in the vicinity of said PN junction.

According to further aspect of the invention, a semiconductor device of band-to-band tunneling type comprises:

a first semiconductor region having one conductivity type and including first, second and third surfaces, said second and third surfaces being crossed with said first surface at substantially right angles;

a second semiconductor region having the opposite conductivity type and including first, second and third surfaces, said second and third surfaces being crossed with said first surface at substantially right angles, said first surface of the first semiconductor region being adjoined with said first surface of said first semiconductor region to form a PN junction therebetween, said second surfaces of said first and second semi-conductor regions being aligned with each other and said third surfaces of said first and second semiconductor regions being aligned with each other;

a first insulating film applied on said second surfaces of said first and second semiconductor regions;

a second insulating film applied on said third surfaces of said first and second semiconductor surfaces;

a first gate electrode formed on said first insulating film;

a second gate electrode formed on said second insulating film;

a first biasing means for applying a reverse bias voltage across said PN junction; and a second biasing means for applying a gate bias voltage between said first and second gate electrodes.

In the semiconductor device according to the invention, by applying the gate bias voltage such that the depletion region is formed in the first and second semiconductor regions in the vicinity of the PN junction, it is possible to produce a band bend having large height and inclination, so that it is possible to make large a tunneling current at will by increasing gate bias voltage.

BRIEF DESCRIPTION OF THE DRAWINGS

FIG. 1 is a cross sectional view showing a known BBT transistor;

FIG. 2 is a band diagram illustrating the band-to-band tunneling phenomenon in the known BBT transistor shown in FIG. 1;

FIGS. 4A and 4B are plan and cross sectional views, respectively depicting an embodiment of the semiconductor device according to the invention;

FIG. 6 is a cross sectional view illustrating another embodiment of the BBT transistor according to the invention; and FIGS. 7A to 7D are views showing successive steps of a method of manufacturing the BBT transistor shown in FIG. 6.

DESCRIPTION OF THE PREFERRED EMBODIMENTS

Figure 3C:
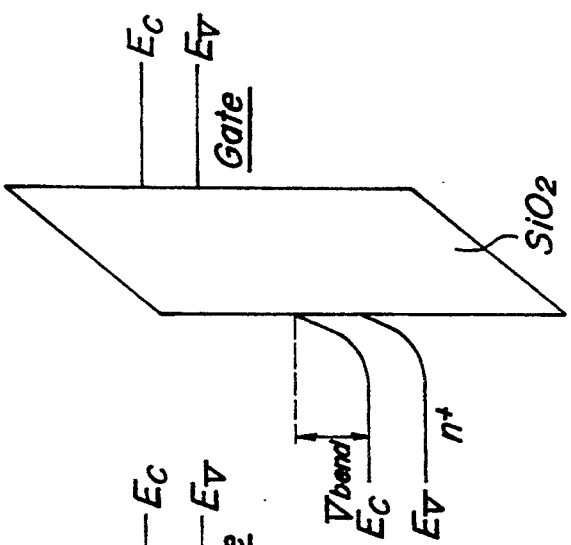
FIGS. 3A, 3B and 3C are band diagrams for explaining the operation of the known BBT transistor.
Figure 3B:
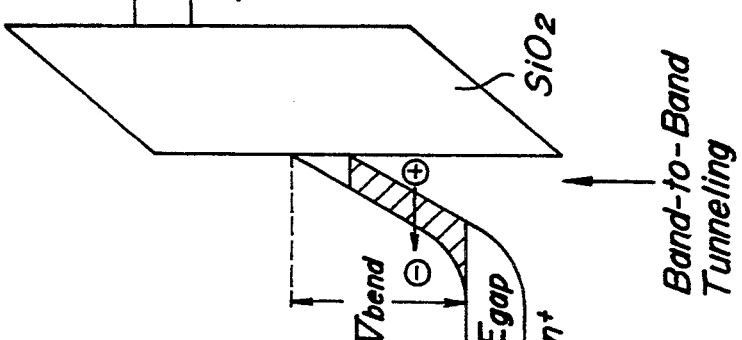
Figure 3A:
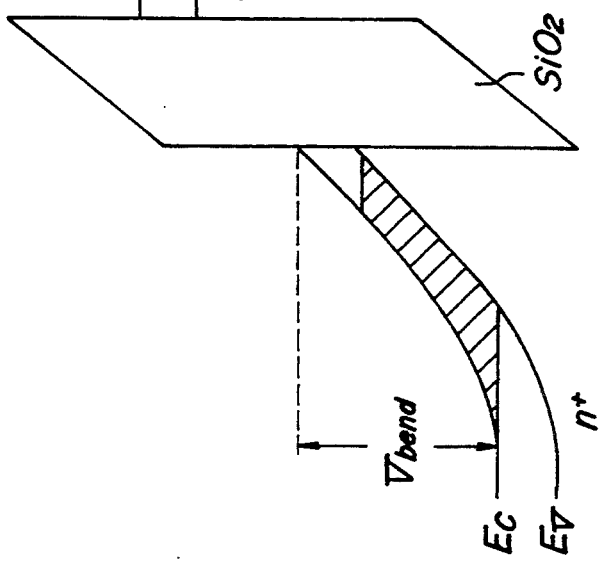

FIGS. 4A and 4B show a first embodiment of the BBT transistor according to the present invention. FIG. 4A is a plan view and FIG. 4B is cross sectional view cut along a line A—A in FIG. 4A. In a surface region of an N type silicon substrate 11, there is formed a surface region 12 having a P type impurity concentration of about $2 \times 10^{20}$ cm$^{-3}$, said surface region constituting a first gate electrode, i.e. a back gate electrode. On the surface region 12 there is formed a first insulating film formed by a silicon oxide film 13 having a thickness of about 200 Å. On the silicon oxide film 13 there is formed a thin silicon film having a thickness of about 1000 Å by any suitable thin silicon film forming method. In a half portion of this thin silicon film N type impurities such as boron are doped at an impurity concentration of about $5 \times 10^{18} \sim 1 \times 10^{20}$ atoms cm$^{-3}$. In the remaining half portion of the silicon thin film P type impurities such as phosphor are doped at an impurity concentration of about $5 \times 10^{18} \sim 1 \times 10^{20}$ atoms cm$^{-3}$. In this manner there are formed P type diffusion region 14 and N type diffusion region 15 which are adjoined with each other by means of a PN junction 16 which extends in a direction perpendicular to a surface of the silicon substrate 11.

On the P and N type regions 14 and 15 there is formed a silicon oxide film 17 having a thickness of about 200 Å which constitutes a second insulating film. On the silicon oxide film 17 there is provided a second gate electrode 18, i.e. a top gate electrode formed by a metal film such that the top gate electrode situates above the PN junction 16.

The P type region 14 is connected to a negative terminal of a reverse bias voltage source 19 and the N type region 15 is connected to a positive terminal of the reverse bias voltage source 19, so that the PN junction is reversely biased. In FIG. 4A there are shown contact pads 14a and 15a for connecting the P and N type regions 14 and 15 to the reverse bias voltage source 19. Further the back gate electrode 12 is connected to a positive terminal of a gate bias voltage source 20 and the top gate electrode 18 is connected to a negative terminal of the gate bias voltage source. In FIG. 4A there are shown contact pads 18a for connecting the top gate electrode 18 to the gate bias voltage source 20.

Figure 5:
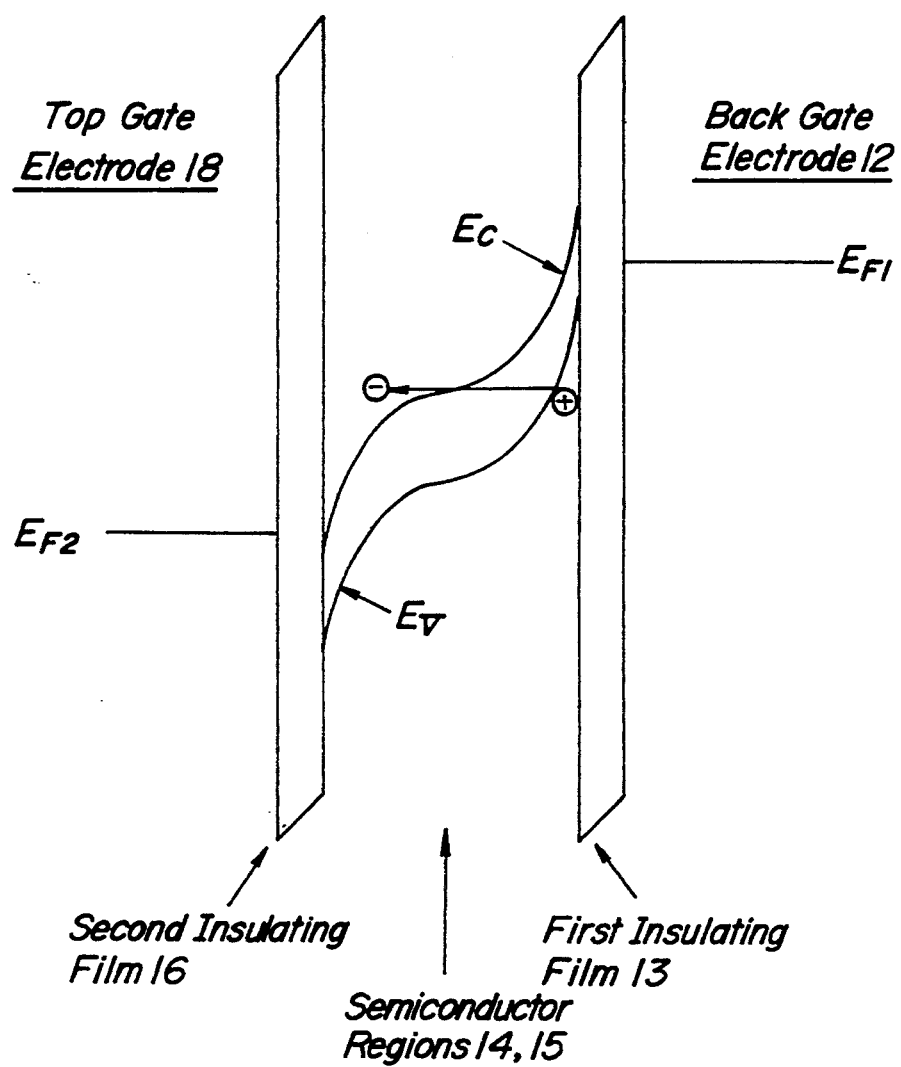
FIG. 5 is a band diagram for explaining the operation of the semiconductor device shown in FIGS. 4A and 4B.

When no gate bias voltage is applied across the back gate electrode 12 and the top gate electrode 18, no current flows through the PN junction 16, because no band bend occurs and the band-to-band tunneling does not take place. When the gate bias voltage is applied across the back gate electrode 12 and the top gate electrode 18, in pats of the P and N type semiconductor regions 14 and 15 which situate between the back and top gate electrodes the energy band is bent and the band-to-band tunneling occurs as illustrated in FIG. 5. Then, minority carriers in the valence band are transferred into the conduction band through the band gap by the band-to-band tunneling phenomenon. That is to say, both electrons and holes are generated in the depletion region of the PN junction. Then the electrons are promptly moved into the N type region 15 and the holes are speedly moved into the P type region 14 under the influence of the reverse bias voltage produced by the reverse bias voltage source 19. In this manner the current flows from the N type region 15 to the P type region 14. In the BBT transistor according to the invention, the band bend occurs in the semiconductor regions sandwiched between the back and top gate electrodes 12 and 18, the height and inclination of the band bend can be increased by increasing the gate bias voltage by adjusting the gate bias voltage source 20. Therefore, the band-to-band tunneling can be produced in regardless of the impurity concentration in the semiconductor region, and thus the current flowing through the PN junction 16 can be made large at will.

FIG. 6 is a cross sectional view showing a second embodiment of the semiconductor device according to the invention. It should be noted that this cross sectional view is obtained by cutting the semiconductor device in a plane parallel to the surface of a semi-conductor substrate. In a silicon substrate 31 there are formed N type region 32 and P type region 33 having line-shaped protrusions 32a and 33a, respectively. The line-shaped protrusions 32a and 33a are adjoined with each other by means of a PN junction 34 which extends parpedicularly to the surface of the silicon substrate 31. On side walls of the line-shaped protrusions 32a and 33a of the N and P type regions 32 and 33 there are formed first and second silicon oxide films 35 and 36 and first and second gate electrodes 37 and 38, respectively. In this manner, the line-shaped protrusions 32a and 33a of the N and P type regions 32 and 33 are sandwiched between the first and second gate electrodes 37 and 38 via the first and second insulating films 35 and 36. The N and P type semiconductor regions 32 and 33 are connected to positive and negative terminals of a reverse bias voltage source 39, respectively and the first and second gate electrodes 37 and 38 are connected to negative and positive electrodes of a gate bias voltage source 40.

FIGS. 7A to 7D show successive steps for manufacturing the semiconductor device according to the invention shown in FIG. 6. At first, as depicted in FIG.

7A, in a surface region of the silicon substrate 31 there are formed the N and P type regions 32 and 33 such that the PN junction 34 is formed therebetween. It should be noted that the PN junction 34 extends in a plane which is perpendicular to the surface of the silicon substrate 31. The N type region 32 is formed by introducing N type impurities such as phosphor at a concentration of the order of $10^{19}$ atoms/cm$^3$, and the P type region 33 is formed by doping the P type impurities such as boron at a concentration of the order of $10^{19}$ atoms/cm$^3$.

Next, parts of the silicon substrate 31 and N and P type regions 32 and 33 are removed by the reactive ion etching process to form the line-shaped protrusions 32a and 33a as illustrated in FIG. 7B. Width and height of the line-shaped protrusions 32a and 33a are 0.1 μm and 0.2 μm, respectively. Therefore, a depth of the N and P type regions 32 and 33 has to be deeper than the height of the line-shaped protrusions 32a and 33a. Then, on surfaces of the silicon substrate 31 and N and P type regions 32 and 33 there is formed a silicon oxide film 41 having a thickness of about 200 Å by means of a thermal oxidation process as shown in FIG. 7C. FIG. 7C is a cross sectional view cut along a line A—A in FIG. 7A. Next, on the silicon oxide film 41 there is deposited a poly silicon layer having a thickness of about 3000 Å by means of CVD process. The poly silicon layer is doped with impurities at a very high concentration. Then, this poly silicon layer is etched back such that the silicon oxide film 41 formed on the top of the line-shaped protrusions 32a and 33a is exposed as depicted in FIG. 7D to form the first and second gate electrodes 37 and 38 simultaneously. In the present embodiment, the first and second insulating films 35 and 36 are formed by the same silicon oxide film 41. In this manner, the BBT transistor shown in FIG. 6 can be manufactured.

The BBT transistor of the present embodiment operates in the same manner as that of the previous embodiment illustrated in FIGS. 4A and 4B. The PN junction 34 is reversely biased by the reverse bias voltage source 39 of 5 volts. The gate bias voltage source 40 is connected between the first and second gate electrodes 37 and 38, the large and sharp band bend occurs in depletion regions formed on both sides of the PN junction 34. In the depletion region in the line-shaped protrusion 32a of the N type semiconductor region 32, holes produced in the depletion region are injected into the P type line-shaped protrusion 33a through the PN junction 34 and at the same time electrons produced in the P type protrusion 33a are injected into the N type protrusion 32a under the influence of the bias voltage. In this manner, a tunneling current flows from the N type region 32 to the P type region 33. In the BBT transistor according to the invention, the N and P type semiconductor regions 32 and 33 situating on respective sides of the PN junction 34 are sandwiched between the first and second gate electrodes 37 and 38, so that the width of the depletion region could not expand beyond the gate electrodes. Therefore, the band bend produced in the semiconductor regions 32 and 33 in the vicinity of the PN junction 34 can be made large at will by increasing the gate bias voltage, and thus the tunneling current can be made large at will.

Further, although the inversion layer is formed at an interface between the semiconductor region and the insulating film by the minority carriers produced by the band-to-band tunneling, the minority carriers are promptly swept away from the depletion region through the PN junction 34 under the large reverse bias voltage. Therefore, the inversion layer could not be grown up. In this manner, the height and inclination of the band bend can be increased at will by increasing the gate bias voltage and the magnitude of the tunneling current can be increased at will. For instance, when the gate bias voltage of 5 volts is applied across the first and second gate electrodes 37 and 38, the tunneling current can exceed 100~1000 micro amperes, while the PN junction 34 is reversely biased at the reverse bias voltage of 5 volts. It should be noted that the tunneling current can be changed by adjusting the gate bias voltage source 40, so that a desired switching operation can be achieved at a very high speed.

As explained above, in the semiconductor device according to the invention, the thin semiconductor film is sandwiched between the first and second gate electrodes and the gate bias voltage is applied across the gate electrodes to form the large and sharp band bend, and therefore the it is possible to obtain a large tunneling current. Thus it is possible to realize a high speed transistor having a large current driving property, while the construction of the semiconductor device can be made very small.

Upon comparing the BBT transistor according to the invention with the known bipolar transistor and MOS FET, the BBT transistor has an indefinite input impedance like as the known MOS FET, while the bipolar transistor has a definit input impedance. Therefore, the BBT transistor according to the invention will be compared with the MOS FET in the following table.

|  | MOS FET | BBT Transistor |
| --- | --- | --- |
| operation principle | electron drift motion | electron tunneling |
| conduction type | N and P channel | single type |
| short channel effect | large | small |
| narrow channel effect | large | small |
| limit on miniaturization | ≧0.1 μm due to short channel effect | smaller than 0.1 μm (determined by size of pn junction) |
| driving current | upper limit is existent | no upper limit (determined by reliability of substrate under high electric field) |
|  | saturation in speed | no saturation in electron speed |
| process | fine processing for gate | no fine processing |
|  | sensitive to gate length | not sensitive to gate length |
|  | complicated impurity distribution |  |
| process step number | no particular difference | |
| power consumption | no particular difference | |

Further in the embodiment shown in FIG. 6, the PN junction is formed perpendicularly to the surface of the semiconductor substrate, and thus the gate electrodes and first and second semiconductor regions can be formed in the same surface of the semiconductor substrate and the planer semiconductor device can be obtained. Moreover, in this embodiment, the N and P type semiconductor regions 32 and 33 are formed by introducing the impurities into the surface region of the semiconductor substrate 31, it is no more necessary to form a thin semiconductor film on the insulating film.

The present invention is not limited to the embodiments explained above, but many modifications and alternations may be conceived by those skilled in the art within the scope of the invention. For instance, in the first embodiment illustrated in FIGS. 4A and 4B, the back gate electrode is formed by the semiconductor region, but it may be formed by a metal plate. Further, the polarity of the gate bias voltage source may be reversed. In the above embodiment, the thickness of the first and second insulating films is set to about 200 Å, but it may be varied within a range from several tens Å to 500 Å depending upon the value of the gate bias voltage.

What is claimed is:

1. A semiconductor device of a band-to-band tunneling type comprising:
   a first semiconductor region having one conductivity type and including first, second and third surfaces, said second and third surfaces being crossed with said first surface at substantially right angles;
   a second semiconductor region having the opposite conductivity type and including first, second and third surfaces, said second and third surfaces being crossed with said first surface at substantially right angles, said first surface of the first semiconductor region being adjoined with said first surface of said second semiconductor region to form a PN junction therebetween, said second surfaces of said first and second semiconductor regions being aligned with each other and said third surfaces of said first and second semiconductor regions being aligned with each other;
   a first insulating film applied on said second surfaces of said first and second semiconductor regions;
   a second insulating film applied on said third surfaces of said first and second semiconductor surfaces;
   a first gate electrode formed on said first insulating film and extending over said first semiconductor and second semiconductor regions;
   a second gate electrode formed on said second insulating film and extending under said first semiconductor and second semiconductor regions, wherein said second gate electrode does not contact the first gate electrode;
   a first biasing means for applying a reverse bias voltage across said PN junction; and
   a second biasing means for applying a gate bias voltage across said first and second gate electrodes, wherein a depletion region is formed in the vicinity of the PN junction, said gate bias voltage producing a band bend in said depletion region, the band bend extending into both said first and said second semiconductor regions, wherein minority carriers are transferred to and from a valence band and a conduction band by band-to-band tunneling through said band bend in a direction substantially parallel to the PN junction to produce electrons and holes in the depletion region, said electrons and holes moving through said PN junction by said reverse bias voltage.

2. A semiconductor device according to claim 1, wherein said first gate electrode is formed by a surface region formed in a surface region of a semiconductor substrate, said first insulating film is formed by a first oxide film formed in a surface of said semiconductor substrate, said first and second semiconductor regions are formed by a semiconductor film formed on the first oxide film, said second insulating film is formed by a second oxide film on in a surface of said semiconductor film, and said second gate electrode is formed by a metal film applied on said second oxide film, whereby said PN junction is formed to extend parpendicularly to the surface of the semiconductor substrate.

3. A semiconductor device according to claim 2, wherein said semiconductor film is formed by a silicon film.

4. A semiconductor device according to claim 3, wherein said silicon film has a thickness of about 1000 Å.

5. A semiconductor device according to claim 4, wherein said first and second semiconductor regions are formed by introducing impurities at a concentration of about $5 \times 10^{18} \sim 1 \times 10^{20}$ atoms/cm$^3$.

6. A semiconductor device according to claim 4, wherein said semiconductor substrate and semiconductor film are made of silicon, and said first and second oxide films are formed by first and second silicon oxide films, respectively.

7. A semiconductor device according to claim 6, wherein said first and second silicon oxide films have a thickness in a range from several tens Å to 500 Å.

8. A semiconductor device of a band-to-band tunneling type comprising:
   a first semiconductor region having one conductivity type and including first, second and third surfaces, said second and third surfaces being crossed with said first surface at substantially right angles;
   a second semiconductor region having the opposite conductivity type and including first, second and third surfaces, said second and third surfaces being crossed with said first surface at substantially right angles, said first surface of the first semiconductor region being adjoined with said first surface of said second semiconductor region to form a PN junction therebetween, said second surfaces of said first and second semiconductor regions being aligned with each other and said third surfaces of said first and second semiconductor regions being aligned with each other;
   a first insulating film applied on said second surfaces of said first and second semiconductor regions;
   a second insulating film applied on said third surfaces of said first and second semiconductor surfaces;
   a first gate electrode formed on said first insulating film;
   a second gate electrode formed on said second insulating film;
   a first biasing means for applying a reverse bias voltage across said PN junction; and
   a second biasing means for applying a gate bias voltage across said first and second gate electrodes;
   wherein said first and second semiconductor regions are formed in a surface of a semiconductor substrate and have line-shaped protrusions which extend in a direction perpendicular to the PN junction as well as parallel to the surface of the semiconductor substrate, said first and second insulating films are formed on respective sides of the line-shaped protrusions as well as on the remaining surface of the semiconductor substrate, and said first and second gate electrodes are formed on the first and second insulating films, respectively such that upper surfaces of the first and second gate electrodes and the line-shaped protrusions are flush with each other.

9. A semiconductor device according to claim 8, wherein said semiconductor substrate is formed by a silicon substrate and said first and second insulating films are formed by one and same silicon oxide film formed on the semiconductor substrate and line-shaped protrusions.

10. A semiconductor device according to claim 9, wherein said line-shaped protrusions have a width of about 0.1 μm and a height of about 0.2 μm.

11. A semiconductor device according to claim 10, wherein said line-shaped protrusions are formed by a reactive ion etching.

12. A semiconductor device according to claim 9, wherein said first and second gate electrodes are formed by poly silicon films.

13. A semiconductor device according to claim 12, wherein said first and second poly silicon films are formed by back-etching a poly silicon layer.

14. A semiconductor device of a band-to-band tunneling type comprising:
   a first semiconductor region having one conductivity type and including a surface;
   a second semiconductor region having the opposite conductivity type and including a surface which is adjoined with said surface of said first semiconductor region to form a PN junction therebetween;
   a first biasing means for applying a reverse bias voltage across said PN junction; and
   a second biasing means for applying a gate bias voltage across said first and second semiconductor regions such that a depletion region is produced in said first and second semiconductor regions in the vicinity of said PN junction, said second biasing means extending adjacent both said first semiconductor region and said second semiconductor region, said gate bias voltage forming a band bend in said depletion region wherein minority carriers are transferred to and from a valence band and a conduction band by band-to-band tunneling to produce electrons and holes in the depletion region, the band bend extending into both said first and said second semiconductor regions, said electrons and holes tunnelling through said band bend in a direction substantially parallel to said PN junction to move through said PN junction by said reverse bias voltage.

15. A semiconductor device according to claim 14, wherein said second biasing means is constructed such that an electric field is generated in said first and second semiconductor regions in a direction substantially parallel with said PN junction.

16. A semiconductor device according to claim 15, wherein said second bias means comprises first and second gate electrodes each being provided on respective sides of the first and second semiconductor regions and first and second insulating films each being provided between the first and second semiconductor regions and the first and second gate electrodes.

* * * * *